SEMICONDUCTOR VARACTOR DIODE WITH UNDULATE PN JUNCTION

Filed Nov. 9, 1967 2 Sheets-Sheet 1

Inventors
JOSEPH FRANKS
DEREK H. MASH
JACK R. PETERS
By
Attorney

Feb. 10, 1970 J. FRANKS ET AL 3,495,137

SEMICONDUCTOR VARACTOR DIODE WITH UNDULATE PN JUNCTION

Filed Nov. 9, 1967 2 Sheets-Sheet 2

Inventors
JOSEPH FRANKS
DEREK H. MASH
JACK R. PETERS
By [signature]
Attorney

United States Patent Office 3,495,137
Patented Feb. 10, 1970

3,495,137

SEMICONDUCTOR VARACTOR DIODE WITH UNDULATE PN JUNCTION

Joseph Franks, Derek Hubert Mash, and Jack Rowland Peters, Harlow, Essex, England, assignors to International Standard Electric Corporation, New York, N.Y., a corporation of Delaware Filed Nov. 9, 1967, Ser. No. 681,623
Claims priority, application Great Britain, Nov. 22, 1966, 52,156/66
Int. Cl. H01l 3/00, 5/00
U.S. Cl. 317—234 6 Claims

ABSTRACT OF THE DISCLOSURE

This is an invention of a varactor diode having a PN junction with multiple indentations extending from a semiconductor layer of higher resistivity into a semiconductor layer of lower resistivity. The angle, number and size of the indentations together with the reverse biasing voltage of the PN junction determine the junction capacitance.

Background of the invention

This invention relates to varactor diodes.

Varactor diodes are extensively used in parametric amplifiers, harmonic generators and other circuits, and for variable capacitors. The important characteristic of these devices is that the capacity of the junction varies with applied voltage. This effect is achieved by virtue of the expansion of the junction depletion layer under reverse applied voltage. At an abrupt junction, the expansion of the depletion layer results in a capacity C changing inversely with the square root of the applied voltage V. At a graded junction C varies inversely with V⅓. These changes can be used for harmonic generation, but the small and graded dependance of capacity on voltage is not ideal for the purpose. In conventional varactors, the capacity change arises from the expansion of the depletion layer, which its area remains constant.

An object of the present invention is to obtain a change in both width and area of the depletion layer with voltage, resulting in a sensitive, controlled and increased variation of capacity with voltage, and with increased capacity range.

According to the invention there is provided a varactor diode including a first layer of semiconductor material of one conductivity type on an insulating substrate and a second layer of semiconductor material of opposite conductivity type to that of the first layer adjacent to or surrounded by said first layer and extending to said substrate, in which one of said layers is of higher resistivity than the other of said layers and in which the junction between said layers is multiple indented from the layer of high resistivity into the layer of lower resistivity.

Summary

The invention herein is based upon the multiple indentations in the PN junction of a varactor diode resulting in sensitive, controlled and increased variation and range of junction capacitance with change in the reverse biasing of the PN junction. The improvement in operation of the device over the prior art is a result of a change in capacitance arising from an expansion in both width and area of the depletion layer with increase in reverse bias voltage whereas in the prior art the capacitance change arose from the expansion of the depletion layer while the area remained constant.

In the drawings

Detailed description

Figure 1:
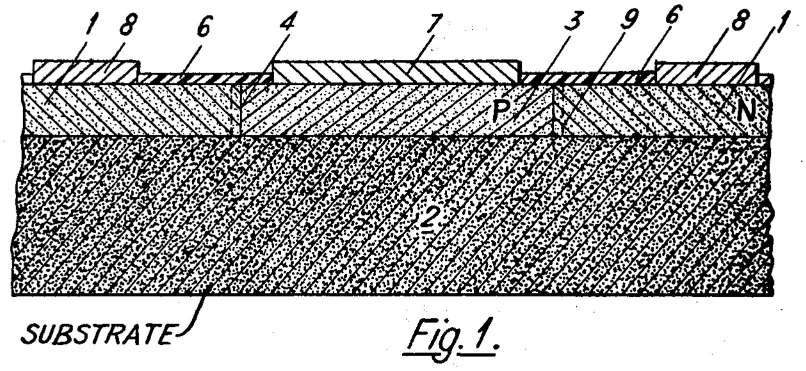
FIG. 1 is a sectioned side elevation of a varactor diode according to the invention.

Referring to FIG. 1, a layer 1 of N-type gallium arsenide on a substrate 2 of semi-insulating gallium arsenide laterally surrounds a layer 3 of P-type gallium arsenide which extends down to the substrate 2.

Figure 2:
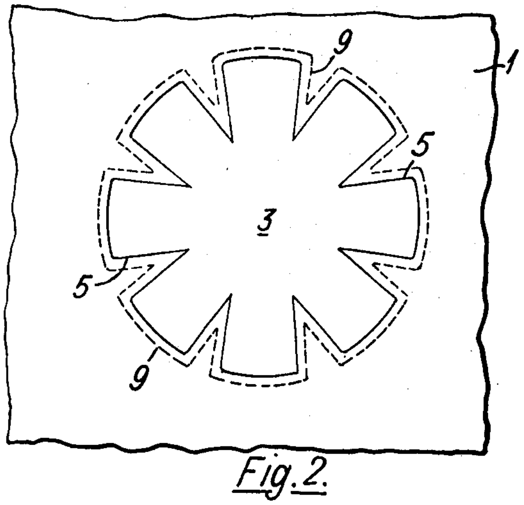
FIG. 2 is a plan view of the diode showing the shape of the junction.

The N-type layer 1 is of higher resistivity than the P-type layer, and the shape of the peripheral junction 4, normal to the substrate 2, between the N-type layer 1 and the P-type layer 3 is shown in FIG. 2, being of generally circular form with multiple indents 5 from the N-type side of the junction into the P-type side.

The N-type and P-type layers are passivated by a silica film 6 except where an ohmic contact 7 is made to the P-type layer 3 and an annular ohmic contact 8 is made to the N-type layer 1. The contact 8 has an inner radius greater than the maximum excursion of the boundary of the depletion layer from the junction 4 into the N-type layer 1.

With an increasing reverse bias applied to the varactor diode via the contacts 7 and 8, the boundary of the depletion layer indicated by the dashed line 9 in the higher resistivity N-type layer 1 will adopt a more and more circular form as it expands outwardly into the N-type layer 1, the capacitance falling as a function of the angle of the indentations 5 and their number and size.

Manufacture of the varactor diode may entail the following steps. A semi-insulating gallium arsenide substrate has either a layer of N-type gallium arsenide epitaxially deposited thereon, or a portion of the substrate is converted to form the N-type layer. A silica layer is then provided over the N-type layer.

A number of varactor diodes may be simultaneously manufactured on a common substrate, and the next step is therefore to form in the silica layer by conventional photolithographic techniques a plurality of spaced windows each shaped so that on subsequent diffusion into the N-type layer of a P-type diffusant, a corresponding plurality of P-type regions are formed each as shown in the drawings, extending down to the substrate.

Final manufacturing steps involve the provision of ohmic contacts to the P-type layers, and the removal of annular portions of the silica layer over the N-type layer around each P-type layer and the provision of annular ohmic contacts to the N-type layer. The individual diodes are finally separated.

A varactor diode as described above of very small capacitance has contacts of relatively large area, and in addition conduction of heat from the junction is more favorable than in conventional varactor diodes.

Full tailoring of the C–V and Q–V curves to obtain desired or optimum conditions is by simply choosing the appropriate outline shape for the diffusion. This is done by the photolithographic process, and parameters adjusted to suit individual requirements simply by making a suitable photographic mask.

The shape of the junction needed for a given capacitance-voltage function can be determined in the following way. Let the required relationship be $$C_V = \frac{C_0}{(V+\phi)^n}$$

where $C_V$ is the capacitance at applied voltage V.
$C_0$ is the capacitance at applied voltage zero.
$\phi$ is the built-in voltage (=approximately 1 for gallium arsenide).

Figure 3:
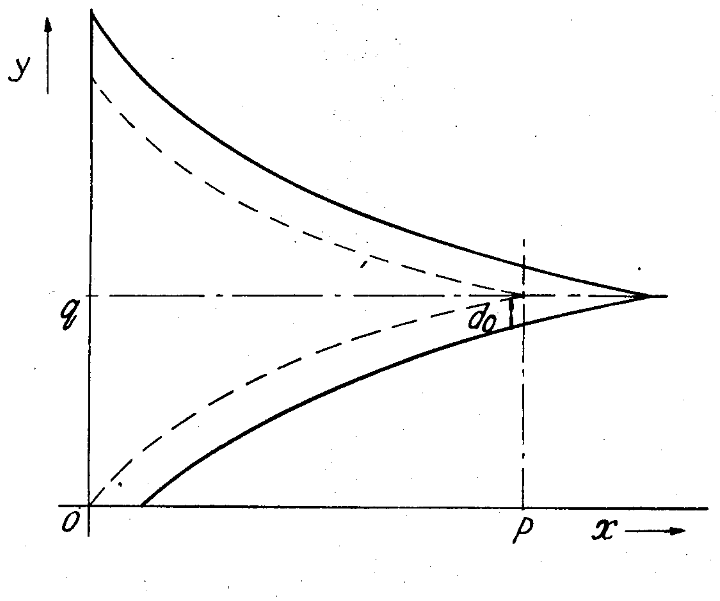
FIG. 3 is a graphical representation of part of the junction shape.

Let the shape of one of the indentations in the junction shown in FIG. 2 be as shown in FIG. 3, plotted on conventional rectilinear coordinates such that the depletion layer, represented by the dashed line, passes through the origin and the point $(p, q)$.

Then the equation of the junction for the above C–V law is $$y=q-d_0\left(\frac{p}{x}\right)^{\frac{1}{2n-1}}$$

where $d_0$ is the depletion layer width at zero applied voltage.

The equation is an approximation that does not hold for low values of $x$.

As alternative structures to that shown in the drawings, the surrounding layer on the substrate may be of P-type and the surrounded layer of N-type, with the surrounding layer being of higher resistivity than the surrounded layer. In this case the depletion layer boundary will expand from the junction outwardly as before with increasing reverse bias.

If the surrounded layer (P- or N-type) is of higher resistivity than the surrounding layer (N- or P-type respectively) then the boundary will expand from the junction inwardly with increasing reverse bias. With a suitably chosen shape or size, angle and number of indentations for the peripheral junction from the higher resistivity layer into the lower resistivity layer, the depletion layer boundary may be caused to assume a more and more circular form to give the required rate of change of capacitance with change in reverse bias.

Instead of forming the N- and P-type layers of gallium arsenide, other suitable semiconductor materials such as germanium of gallium phosphide may be used on a semi-insulating gallium arsenide substrate.

Materials other than semi-insulating gallium arsenide may be used for the insulating substrate, in conjunction with suitable semiconductor material to form the P- and N-type layers.

For example, sapphire may be used as the substrate and epitaxial silicon deposited onto it, subsequent diffusion being carried out in the epitaxial silicon layer. Alternatively, silicon dioxide may be grown on a wafer of single crystal silicon, and then backed up with, say, polycrystalline silicon. The wafer is then inverted, the single crystal layer lapped or etched to the required thickness, and the opposite type region formed through the single crystal layer by diffusion or by other well-known methods.

The general shape of the device is not limited to the circular shape given in the embodiment, but may be varied to suit specific requirements. For example, the two semiconductor layers may be arranged side by side on the insulating substrate with a generally straight junction therebetween multiple indented from the layer of higher resistivity into the layer of lower resistivity.

It is to be understood that the foregoing description of specific examples of this invention is made by way of example only and is not to be considered as a limitation on its scope.

We claim:

1. A varactor diode comprising a first layer of semiconductor material of one conductivity type on an insulating substrate and a second layer of semiconductor material of opposite conductivity type to that of said first layer surrounded by said first layer and extending to said substrate, one of said layers being of higher resistivity than the other of said layers and PN-junction between said layers multiple indented from said layer of higher resistivity into said layer of lower resistivity.

2. A varactor diode as claimed in claim 1 in which said substrate is semi-insulating gallium arsenide, and said first and second layers are semiconducting gallium arsenide.

3. A varactor diode as claimed in claim 1 in which said substrate is semi-insulating gallium arsenide, and said first and second layers are semiconducting gallium phosphide.

4. A varactor diode as claimed in claim 1 in which said substrate is semi-insulating gallium arsenide, and said first and second layers are semiconducting germanium.

5. A varactor diode as claimed in claim 1 in which said substrate is sapphire and said first and second layers are semiconducting silicon.

6. A varactor diode as claimed in claim 1 in which said substrate is silicon dioxide grown on a wafer of monocrystalline silicon and backed with polycrystalline silicon, and said first and second layers are formed in said monocrystalline silicon after said wafer has been reduced to a suitable thickness.

References Cited

UNITED STATES PATENTS

| | | | |
|---|---|---|---|
| 3,163,562 | 12/1964 | Ross | 317—234 |
| 3,221,218 | 11/1965 | Hilsum | 317—234 |
| 3,248,614 | 4/1966 | Rutz | 317—234 |
| 3,267,338 | 8/1966 | Marinace | 317—234 |

JAMES D. KALLAM, Primary Examiner

U.S. Cl. X.R.

317—237